US009429982B2

(12) United States Patent
Atallah et al.

(10) Patent No.: US 9,429,982 B2
(45) Date of Patent: Aug. 30, 2016

(54) CONFIGURABLE LAST LEVEL CLOCK DRIVER FOR IMPROVED ENERGY EFFICIENCY OF A RESONANT CLOCK

(71) Applicant: QUALCOMM Incorporated, San Diego, CA (US)

(72) Inventors: Francois Ibrahim Atallah, Raleigh, NC (US); David Joseph Winston Hansquine, Raleigh, NC (US); Richard Duane Tax, Cary, NC (US); Robert Simpson Taylor, Raleigh, NC (US)

(73) Assignee: QUALCOMM Incorporated, San Diego, CA (US)

( * ) Notice: Subject to any disclaimer, the term of this patent is extended or adjusted under 35 U.S.C. 154(b) by 53 days.

(21) Appl. No.: 14/499,152

(22) Filed: Sep. 27, 2014

(65) Prior Publication Data
US 2016/0091918 A1 Mar. 31, 2016

(51) Int. Cl.
| G06F 1/04 | (2006.01) |
| G06F 1/10 | (2006.01) |
| H03K 3/012 | (2006.01) |
| G06F 1/32 | (2006.01) |
| H03K 19/00 | (2006.01) |

(52) U.S. Cl.
CPC . G06F 1/10 (2013.01); G06F 1/32 (2013.01); G06F 1/3237 (2013.01); H03K 3/012 (2013.01); H03K 19/0008 (2013.01); H03K 19/0019 (2013.01)

(58) Field of Classification Search
CPC ....................................................... G06F 1/10
See application file for complete search history.

(56) References Cited

U.S. PATENT DOCUMENTS

| 5,559,463 A | 9/1996 | Denker et al. |
| 6,690,243 B1 * | 2/2004 | Henrion .................. H03B 5/20 331/117 R |
| 8,659,338 B2 | 2/2014 | Papaefthymiou et al. |
| 8,742,817 B2 | 6/2014 | Sathe et al. |
| 2011/0084736 A1 | 4/2011 | Papaefthymiou et al. |
| 2014/0062564 A1 | 3/2014 | Sathe et al. |
| 2014/0062566 A1 | 3/2014 | Sathe et al. |

FOREIGN PATENT DOCUMENTS

| WO | 2008133739 A2 | 11/2008 |
| WO | 2014036457 A1 | 3/2014 |

OTHER PUBLICATIONS

International Search Report and Written Opinion—PCT/US2015/050422—ISA/EPO—Jan. 5, 2016.

* cited by examiner

*Primary Examiner* — Daniel Puentes
(74) *Attorney, Agent, or Firm* — Muncy, Geissler, Olds & Lowe, P.C.

(57) ABSTRACT

Systems and methods are directed to a configurable last level driver coupled to a inductor-capacitor (LC) tank or resonant clock, for improving energy efficiency of the resonant clock. In a warm up stage, the last level clock driver can be enabled to store energy in the LC tank, and in a gating stage, the last level clock driver can be fully or partially disabled such that energy stored in the LC tank can be recirculated into a clock distribution network. In a refreshing stage, the last level clock driver can be enabled to replenish the energy lost by the LC tank in the recirculation of energy into the clock distribution network during the gating stage. Programmable counters can be used to control durations of the warm up, gating, and refreshing stages.

25 Claims, 4 Drawing Sheets

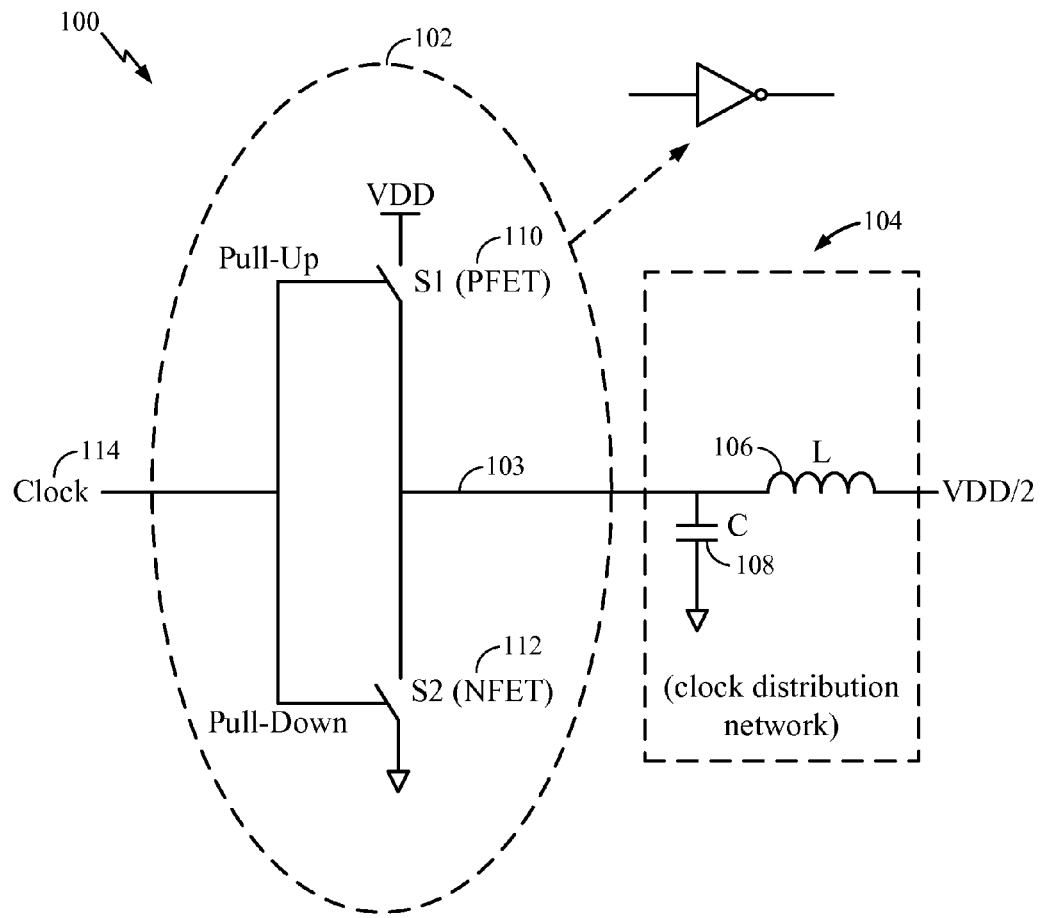
CONVENTIONAL
FIG. 1

CONFIGURABLE LAST LEVEL CLOCK DRIVER FOR IMPROVED ENERGY EFFICIENCY OF A RESONANT CLOCK

FIELD OF DISCLOSURE

Disclosed aspects are directed to designs of clock drivers for energy efficient clock distribution. More particularly, exemplary aspects relate to a configurable last level driver coupled to a inductor-capacitor (LC) tank or resonant clock circuit, wherein gates of the last level clock driver can be controllably turned on or off to reuse energy stored in the LC tank in a clock distribution network.

BACKGROUND

Designs of modern processing systems face an ever increasing demand for reduction in power and energy. This is particularly seen in the realm of mobile and handheld devices which require extended battery life. One significant source of power consumption in these devices lies in their clock distribution networks and systems.

Conventional clock distribution networks include resonant clocking mechanisms which may use several levels of clock drivers to charge an inductor-capacitor (LC) tank. The LC tanks can store the energy supplied by the clock drivers and recirculate the energy into the clock distribution network during charging and discharging cycles of the clock distribution network. The efficiency of the LC tanks is conventionally measured in terms of the quality factor (or "Q factor") of the inductor L. In general, as the Q factor increases, the LC tank is more efficient with regard to its capacity to store and recirculate energy.

Conventional clock drivers drive a supply current into the LC tank at each clock phase of a system clock. In conventional designs, the drive strengths of the clock drivers in the various levels are reduced in an effort to reduce energy consumption of the clock distribution network. While reducing the drive strength in this manner may reduce the amount of energy consumed by the clock drivers, the conventional clock drivers do not efficiently utilize the energy that is recirculated by the LC tanks.

SUMMARY

Exemplary aspects include systems and methods directed to a configurable last level driver coupled to a inductor-capacitor (LC) tank or resonant clock, for improving energy efficiency of the resonant clock. In a warm up stage, the last level clock driver can be enabled to store energy in the LC tank, and in a gating stage, the last level clock driver can be fully or partially disabled such that energy stored in the LC tank can be recirculated into a clock distribution network. In a refreshing stage, the last level clock driver can be enabled to replenish the energy lost by the LC tank in the recirculation of energy into the clock distribution network during the gating stage. Programmable counters can be used to control durations of the warm up, gating, and refreshing stages.

For example, an exemplary aspect is directed to a method of operating a last level clock driver, the method comprising: in a first stage, enabling the last level clock driver to store energy in an inductor-capacitor (LC) tank, and in a second stage, fully or partially disabling the last level clock driver and recirculating the energy stored in the LC tank into a clock distribution network.

Another exemplary aspect is directed to an apparatus comprising: a last level clock driver coupled to an inductor-capacitor (LC tank). In a first stage, the last level clock driver is configured to be enabled to store energy in the inductor-capacitor (LC) tank. In a second stage, the last level clock driver is configured to be fully or partially disabled, to recirculate the energy stored in the LC tank into a clock distribution network.

Yet another exemplary aspect is directed to a system comprising: in a first stage, means for enabling a last level clock driver to store energy in an inductor-capacitor (LC) tank, and in a second stage, means for fully or partially disabling the last level clock driver to recirculate the energy stored in the LC tank into a clock distribution network.

BRIEF DESCRIPTION OF THE DRAWINGS

The accompanying drawings are presented to aid in the description of aspects of the invention and are provided solely for illustration of the aspects and not limitation thereof.

FIG. 1 illustrates a conventional clock distribution system.

DETAILED DESCRIPTION

Figure 2:
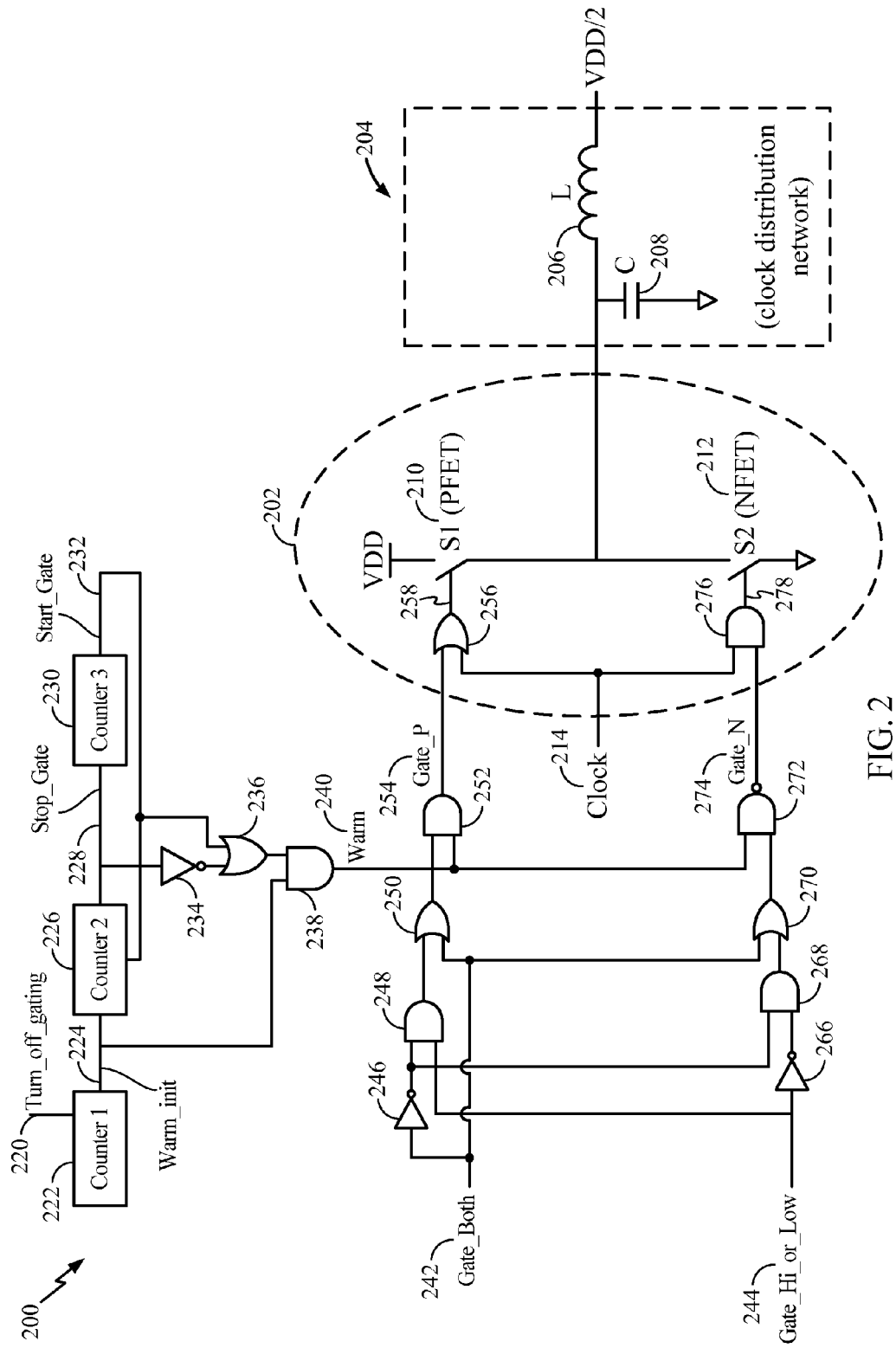
FIG. 2 illustrates an exemplary clock distribution system with a configurable last level clock driver.

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

As previously discussed, clock distribution networks can include a plurality of clock drivers in a plurality levels, which supply current to an LC tank. The clock driver which is in a last level that is closest to and connected to the LC tank, is referred to as a last level clock driver. In conventional designs, the drive strengths of the plurality of clock drivers, including the drive strength of the last level clock driver, may be reduced in an effort to reduce energy consumption of the clock distribution network.

With reference now to FIG. 1, conventional system 100 comprising a clock distribution network is illustrated. Last level clock driver 102 is coupled to LC tank 104 comprising inductor (L) 106 and capacitor (C) 108. Capacitor 108 represents a clock distribution network. Last level clock driver 102 is shown to be driven by clock 114. There may be several other levels of clock drivers such as last level clock driver 102 (not shown) which may be coupled to last level clock driver 102 and driven by clock 114, for example. Last level clock driver 102 is functionally equivalent to a logical invertor and comprises a first gate, pull-up transistor 110 coupled to positive supply voltage VDD and a second gate, pull-down transistor 112 coupled to ground. With the conventional designs described above, during a positive phase of clock 114, output 103 of last level clock driver 102 is driven low, thus discharging LC tank 104 and the clock distribution network through pull-down transistor 112. During a negative phase of clock 114, output 103 is driven high, thus charging LC tank 104 and the clock distribution network. Thus, in both these phases, last level clock driver 102 supplies current (positive or negative) to LC tank 104, which then charges or discharges the clock distribution network. However, after an initial few cycles of supplying current to LC tank 104, LC tank 104 may become capable of storing sufficient charge to circulate energy into the clock distribution network, without needing to be recharged or supplied current every cycle or every phase of clock 114. Conventional system 100 does not avail of the potential of LC tank 104 for recirculating energy and thus further reducing power consumption of system 100.

In contrast to the above-described conventional system 100, exemplary aspects include clock distribution systems which are configured for reusing and recirculating the charge stored in LC tanks. More specifically, exemplary last level clock drivers are programmable such that one or both gates of the last level clock driver can be flexibly and controllably turned on or off. When a gate is turned off for a clock phase, corresponding current (positive or negative) is not supplied to the LC tank during that clock phase. Energy stored in the LC tank can be recirculated into the clock distribution network during these clock phases when the gates of the exemplary last level clock driver are turned off, thus reusing energy and minimizing power consumption. In this disclosure, the last level clock driver is referred to as being fully enabled when both gates of the last level clock driver are turned on and fully disabled when both gates of the last level clock driver are turned off. When only one of the two gates is turned on and the other one of the two gates is turned off, then the last level clock driver is said to be partially enabled or partially disabled.

Moreover, in exemplary aspects, exemplary counters may be implemented to control various aspects of timing and functionality related to the gates of the exemplary last level clock drivers. With these counters, aspects related to number of clock phases or cycles for which the LC tank needs to be warmed up, and the number of clock phases or cycles during which either one or both gates of the last level clock driver can be turned on or off, etc., can be dynamically controlled. The above and further exemplary aspects will now be explained with reference to the figures.

Referring to FIG. 2, exemplary system 200 is shown. Similar to conventional system 100 of FIG. 1, system 200 also includes last level clock driver 202 coupled to LC tank 204, which comprises inductor (L) 206 and capacitor (C) 208. Capacitor 208 represents a clock distribution network. Last level clock driver 202 is driven by clock 214, and once again, there may be several other levels of clock drivers such as last level clock driver 202 (not shown) which may be coupled to last level clock driver 202 and driven by clock 214, for example. Last level clock driver 202 comprises a first gate, pull-up transistor 210 (configured, for example, as a p-channel field effect transistor or "PFET") coupled to positive supply voltage VDD and a second gate, pull-down transistor 212 (configured, for example, as a n-channel field effect transistor or "NFET") coupled to ground.

However, deviating from conventional aspects, the first and second gates of exemplary last level clock driver 202 can be flexibly turned on or off. For example, when the first gate, pull-up transistor 210, is turned on, it charges LC tank 204 and the clock distribution network. If pull-up transistor 210 is turned off or gated off (or simply, "gated") the current supply path from VDD to LC tank 204 and the clock distribution network is turned off. However, once LC tank 204 is sufficiently charged after several clock cycles, LC tank 104 can recirculate the charge stored therein into the clock distribution network, even when pull-up transistor 210 is gated off. Similarly, when the second gate, pull-down transistor 212 is turned on, it discharges LC tank 204 and the clock distribution network. If pull-down transistor 212 is gated off discharge path from LC tank 204 and the clock distribution network towards ground is turned off. However, once LC tank 204 is sufficiently charged after several clock cycles, LC tank 104 can discharge the clock distribution network, even when pull-down transistor 212 is gated off. In this manner, exemplary system 200 can conserve energy and reduce power consumption by gating of one or both of pull-up transistor 210 and pull-down transistor 212.

Programmable counters and logic gates as shown in FIG. 2 can be used to control the gating of one or both of pull-up transistor 210 and pull-down transistor 212. The operation of system 200 will be described with regard to two or more stages. A first stage can include a warm up stage which can comprise several clock cycles of clock 214. In order utilize and reuse the energy stored in LC tank 204 for charging/discharging the clock distribution network as described above, LC tank 204 is "warmed up" which refers to operating last level clock driver 202 in a conventional manner with both gates fully enabled, for one or more clock cycles until LC tank 204 stores sufficient charge or reaches a maximum energy level. In more detail, in the warm up stage, last level clock driver 202 has both pull-up transistor 210 and pull-down transistor 212 turned on, such that last level clock driver 202 is functionally equivalent to an inverter, supplying or driving current (positive/negative) every cycle and during both phases of clock 214, until inductor 206 of LC tank 204 reaches its maximum energy. The duration of the warm up stage can be based on the Q factor of LC tank 204, for example, which relates to the efficiency of LC tank 204 and its ability to effectively store energy.

In FIG. 2, a programmable first counter 222 is programmed with a first count value or a first number of clock cycles corresponding to a duration of the warm up stage. In some aspects, first counter 222 may be activated or reset to begin counting through the number of cycles of the warm up stage every time a root of clock 214 is gated (which can pertain to a system reboot or reset). The output of first counter 222 is shown as the signal warm_init 224, which is active high when first counter 222 has finished counting through the first number of clock cycles for the warm up stage. For example, once first counter 222 is activated or enabled after a reset, warm_init 224 may transition to an active high state after a first count time corresponding to the warm up stage, for example.

Second counter 226 is enabled at the end of the warm up stage, when a second stage of last level clock driver begins. This second stage is a gating stage and can include a first mode and a second mode. Second counter 226 is programmed with a second count value corresponding to a duration of the gating stage. As previously described, in the first mode of the gating stage, last level clock driver 202 is fully disabled and in the second mode of the gating stage, last level clock driver 202 is partially disabled. In more detail, second counter 226 is enabled when warm_init 224 transitions to active high or to logic "1." Second counter 226 is programmed to count for a second number of cycles of clock 214 during which one or both of pull-up transistor 210 and pull-down transistor 212 are gated off. When both of pull-up transistor 210 and pull-down transistor 212 are gated off, last level clock driver 202 is fully disabled, as previously described. When only one of the two transistors is gated off while the other one of the two transistors is gated on, last level clock driver 202 is partially enabled or partially disabled. The selective gating of these transistors is described in the following sections based on control signals gate_both 242 for fully disabling and gate_hi_or_low 244 for partially disabling last level clock driver 202. Once second counter 226 has finished counting its second number of clock cycles at a second count time, the signal stop_gate 228 transitions to active high or logic "1."

After the gating stage, a recharging stage is entered. In the recharging stage, the stored energy that has been depleted from LC tank 204 is replenished. Last level clock driver 202 is configured in the recharging stage in a similar manner as described above in the first stage or the warm up stage. Third counter 230 is programmed with a third count value corresponding to a third number of clock cycles which in turn corresponds to a duration of the recharging stage. Third counter 230 is enabled by stop_gate 228 being active high. Third counter 230 is used to count to a third count time at which point the signal start_gate 232 transitions to active high or logic "1." Third counter 230 is used to re-enable normal operation of last level clock driver 202, i.e., to configure last level clock driver 202 as an inverter to drive or supply current to LC tank 204 such that the charge in LC tank 204 which was depleted when one or both of pull-up transistor 210 and pull-down transistor 212 were gated off, can be replenished. Third counter 230 is programmed to ensure that the clock distribution network is seamlessly supplied with charge and there are no interruptions due to LC tank 204 getting depleted. In this manner, the first, second, and third counters (222, 226, and 230) can be used to turn off and on the process of supplying energy to LC tank 204 through last level clock driver 202.

In some aspects, following the warm up stage, last level clock driver 202 can be configured to cycle through the gating stage (first/second mode) and the refreshing stage. In both the warm up stage and the refreshing stage, last level clock driver 202 is fully enabled by enabling both pull-up transistor 210 and pull-down transistor 212 to configure last level clock driver 202 as an inverter or driver.

In a further detailed discussion of the operation of last level clock driver 202, when stop_gate 228 transitions to logic "1," the output of inverter 234 transitions to logic "0." OR gate 236 is fed with the output of inverter 234 and start gate_232. The signal start_gate 232 is also used to disable second counter 226 when active high. The output of OR gate 236 is fed as one input to AND gate 238, while the other input is warm_init 224. Accordingly, the output of AND gate 238 is the signal warm 240, which is used to gate off one or more of pull-up transistor 210 and pull-down transistor 212 based on control signals gate_both 242 and gate_hi_or_low 244. The signal warm 240 is logic "0" during the warm up stage, when warm_init is logic "0" and between the second count time and third count time, when the signal start_gate 232 is logic "1." The signal warm 240 is logic "1" between the first count time and the second count time, when the signal stop_gate is logic "1". When the signal warm 240 is logic "0", last level clock driver 202 is fully enabled. When warm 240 is logic "1," last level clock driver 202 may be fully disabled (in a first mode) or partially disabled (in a second mode) based on control signals gate_both 242 and gate_hi_or_low 244.

Coming now to the control signals gate_both 242 and gate_hi_or_low 244, if the control signal gate_both 242 is logic "1," then both pull-up transistor 210 and pull-down transistor 212 are gated off and last level clock driver 202 is fully disabled. This is the first mode of operation after the warm up stage, when warm 240 is "1". Inverter 246, AND gate 248, OR gate 250, and AND gate 252 are connected in series as shown in FIG. 2, where warm 240 is one input of AND gate 252 and the output of OR gate 250 is another input. The output of AND gate 252 is gate_P 254 which is fed into OR gate 256 along with clock 214 to generate output 258. Inverter 246, AND gate 268, OR gate 270 and NAND gate 272 are connected in series as shown in FIG. 2, where warm 240 is one input of the NAND gate 272 and the output of the OR gate 270 is the other input. The output of NAND gate 272 is gate_N 274 which is fed into AND gate 276 along with clock 214 to generate output 278. Accordingly, when gate_both 242 is logic "1" (and warm 240 is logic "1") pull_up transistor 210 and pull-down transistor 212 are both gated off.

If gate_both is low or logic "0" (and warm 240 is logic "1") then last level clock driver is partially disabled (or enabled) based on the control signal gate_hi_or_low 244. This is the second mode of operation, following the warm up stage. More specifically, when warm 240 is logic "1," if gate_both is logic "0" and gate_hi_or_low 244 is logic "0," only pull-down transistor 212 is gated off. In this case, LC tank 204 discharges the clock distribution network by itself but the charging is accomplished by both last level clock driver 202 and LC tank 204. If gate_both is logic "0" and gate_hi_or_low 244 is logic "1," only pull-up transistor 210 is gated off. In this case, LC tank 204 charges the clock distribution network by itself but the discharging is accomplished by both last level clock driver 202 and LC tank 204.

As shown, gate_hi_or_low 244 feeds into inverter 266, connected to AND gate 268, OR gate 270 and NAND gate 272 as shown, where warm 240 is another input of NAND gate 272. The output of NAND gate 272 is gate_N 274, which is fed into AND gate 276 along with clock 214. The output 258 of OR gate 256 and the output 278 of AND gate 276 control the turning on or off of pull-up transistor 210 and pull-down transistor 212 based on the above control signals and clock 214 in the manner described above in the various stages of operation.

In some aspects, the signal turn_off_gating 220 may be set to logic "1" to disable first counter 222, which causes last level clock driver 202 to be enabled to charge and discharge the clock distribution network alongside LC tank 204, similar to conventional systems. Thus, turn_off_gating 220 may be used as an enable signal to control the exemplary features of flexible gating off of one or more gates of last level clock driver 202.

In this manner, once LC tank 204 has been warmed up, last level clock driver 202 may be disabled in one of two modes. In the first mode, both gates of last level clock driver 202 may be turned off to fully disable last level clock driver 202, and in the second mode only one of the two gates of last level clock driver 202 may be turned off to partially disable last level clock driver 202. In both of these modes, LC tank 204 may supply current or charge/discharge the clock distribution network. In some aspects, prior to depletion of all energy stored in LC tank 204, recharging is performed to bring LC tank 204 up to maximum energy before once again entering one of the two modes of fully or partially disabling last level clock driver 202.

Accordingly, it is seen that last level clock driver 202 can be configured to improve energy efficiency of clock distribution networks or resonant clocks coupled to LC tank 204, by reusing the charge stored in LC tank 204 and avoiding unnecessary supply of energy and charge into the clock distribution network.

Figure 3:
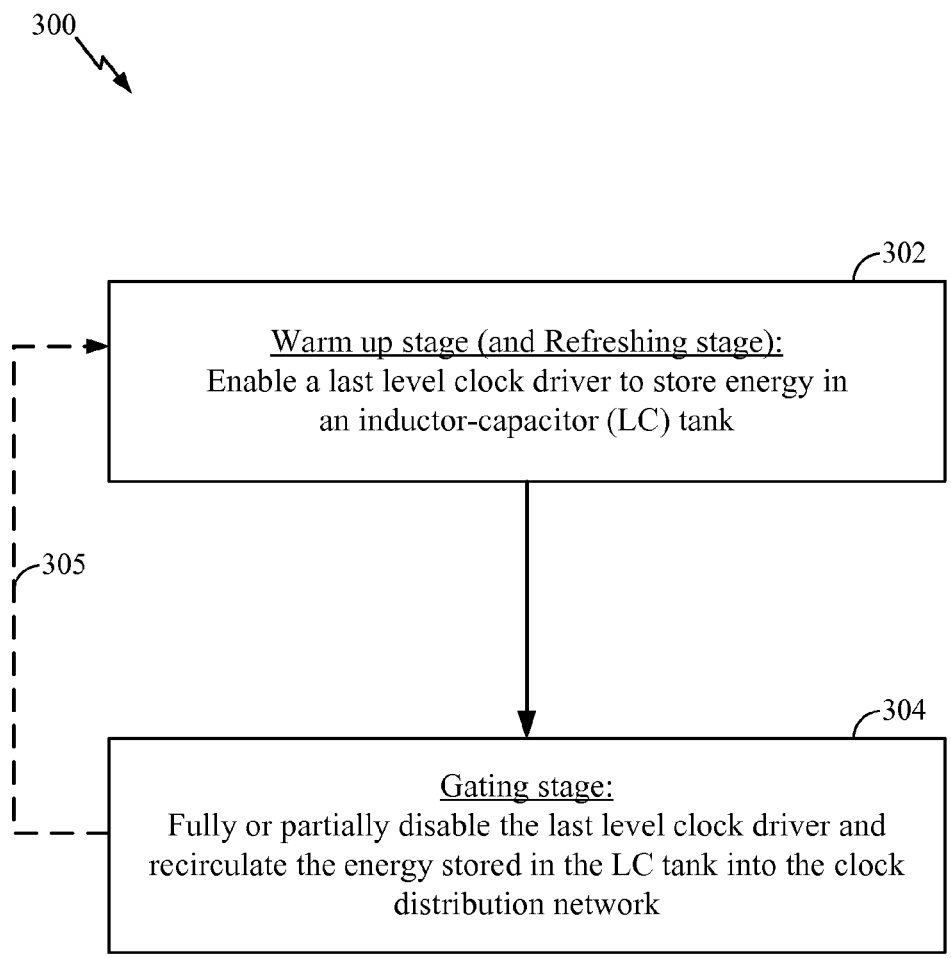
FIG. 3 illustrates a flow-chart pertaining to a method of operating a last level clock driver according to exemplary aspects.

It will be appreciated that aspects include various methods for performing the processes, functions and/or algorithms disclosed herein. For example, as illustrated in FIG. 3, an aspect can include a method (300) of operating a last level clock driver (e.g., 202) of a clock distribution system (e.g., 200).

In Block 302, a warm up stage of method 300 is shown. The warm up stage can span, for example, the duration of first counter 222 counting up to or reaching the first count value. In the warm up stage, last level clock driver 202 is enabled and configured to store energy in an inductor-capacitor (LC) tank (e.g., 204), wherein the capacitor of LC tank 204 is connected a clock distribution network. The first count value can be based on a quality factor of the inductor of LC tank 204. Last level clock driver 202 can be formed from pull-up transistor 210 and pull-down transistor 212. Pull-up transistor 210 and pull-down transistor 212 function together as an inverter or driver to charge or discharge LC tank 204.

In Block 304, a gating stage of method 300 is shown. The gating stage can span, for example, the duration of second counter 226 counting to the second count value. In the gating stage, last level clock driver 202 can be configured in a first mode or a second mode. In the first mode, last level clock driver 202 can be fully disabled, for example, by turning off both pull-up transistor 210 and pull-down transistor 212. In the second mode, last level clock driver 202 can be partially disabled, for example, by turning off at most one of pull-up transistor 210 and pull-down transistor 212. In the first and second modes, last level clock driver 202 can recirculate the energy stored in LC tank 204 into the clock distribution network.

In some aspects, following the gating stage, last level clock driver 202 can enter a refreshing stage, where last level clock driver 202 can be configured similar to the first stage or the warm up stage, i.e., last level clock driver 202 is enabled by turning on pull-up transistor 210 and pull-down transistor 212, in order to store energy (and more specifically, in this case, replenish lost energy) in LC tank 204. Thus, method 300, in the refreshing stage can be similar to Block 302 in the aspects of enabling last level clock driver 202 to store energy in LC tank 204, and accordingly, also illustrated in Block 302. In exemplary aspects, if Block 302 is reached for the refreshing stage, then method 300 may follow path 305 shown in dashed lines from Block 304 back to Block 302. In the refreshing stage, a third counter configured to count to a third count value can be used to time the refreshing stage. In the refreshing stage, the charge that was depleted during the gating stage can be replenished in LC tank 204 by enabling pull-up transistor 210 and pull-down transistor 212 of last level clock driver 202. As noted, last level clock driver 202 can be cycled through the gating stage and the refreshing stage based on aspects such as the quality factor of the inductor, following the warm up stage.

Moreover, in some aspects include a system (e.g., 200) is disclosed, where, in a first stage, the system includes means for enabling a last level clock driver (e.g., 202) to store energy in an inductor-capacitor (LC) tank (e.g., 204). For example, the means for enabling may include the above-described aspects of system 200 used for controllably turning on pull-up transistor 210 and pull-down transistor 212 of last level clock driver 202. System 200 can further include, in a second stage, means for fully or partially disabling the last level clock driver to recirculate the energy stored in the LC tank into a clock distribution network. For example, the means for fully or partially disabling may include the above-described aspects of system 200 used for controllably turning off both or at most one of pull-up transistor 210 and pull-down transistor 212, respectively.

In some aspects, system 200 may further include comprising means for controlling a duration of the first stage (e.g., first counter 222), and means for controlling a duration of the second stage (e.g., second counter 226). System 200 may also include means for enabling last level clock driver 202 to replenish the energy lost by the LC tank in the recirculation of energy into the clock distribution network during the second stage, in a refreshing stage (e.g., the above-described aspects of system 200 used for controllably turning on pull-up transistor 210 and pull-down transistor 212). System 200 may also include means for controlling a duration of the refreshing stage (e.g., third counter 230).

Figure 4:
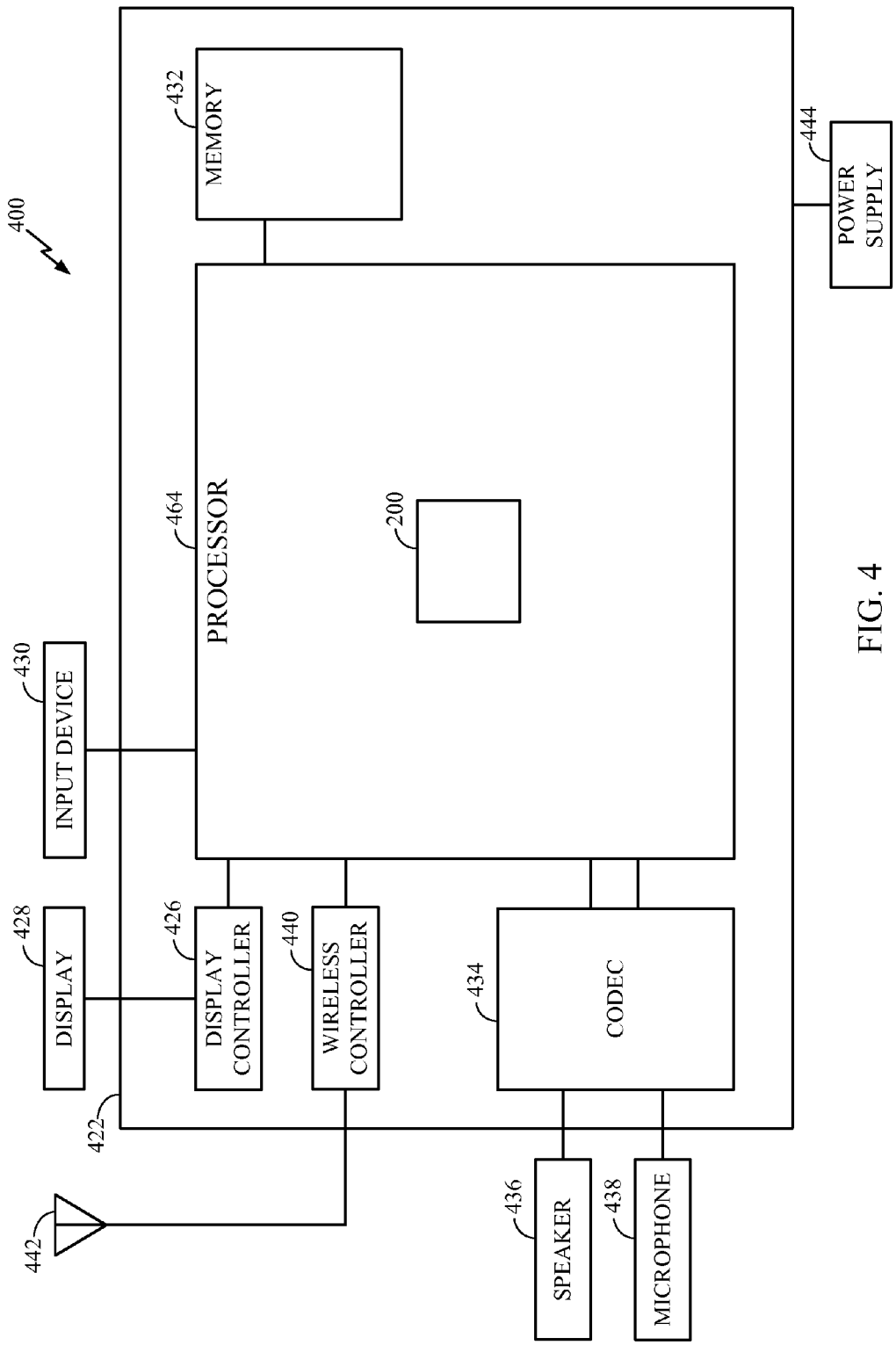
FIG. 4 illustrates a high-level diagram of a wireless device in which exemplary aspects may be advantageously employed.

Referring to FIG. 4, a block diagram of a particular illustrative aspect of wireless device 400 configured according to exemplary aspects is depicted. Wireless device 400 includes processor 464 coupled to memory 432. Processor 464 may comprise system 200 as described in reference to FIG. 2, and may operate system 200 in accordance with the techniques described in reference to FIGS. 2 and 3. FIG. 4 also shows display controller 426 that is coupled to processor 464 and to display 428. Coder/decoder (CODEC) 434 (e.g., an audio and/or voice CODEC) can be coupled to processor 464. Other components, such as wireless controller 440 (which may include a modem) are also illustrated. Speaker 436 and microphone 438 can be coupled to CODEC 434. FIG. 4 also indicates that wireless controller 440 can be coupled to wireless antenna 442. In a particular aspect, processor 464, display controller 426, memory 432, CODEC 434, and wireless controller 440 are included in a system-in-package or system-on-chip device 422.

In a particular aspect, input device 430 and power supply 444 are coupled to the system-on-chip device 422. Moreover, in a particular aspect, as illustrated in FIG. 4, display 428, input device 430, speaker 436, microphone 438, wireless antenna 442, and power supply 444 are external to the system-on-chip device 422. However, each of display 428, input device 430, speaker 436, microphone 438, wireless antenna 442, and power supply 444 can be coupled to a component of the system-on-chip device 422, such as an interface or a controller.

It should be noted that although FIG. 4 depicts a wireless communications device, processor 464 and memory 432 may also be integrated into a set-top box, a music player, a video player, an entertainment unit, a navigation device, a personal digital assistant (PDA), a fixed location data unit, a mobile phone, a smart phone, or a computer. Further, exemplary aspects of the last level clock driver may be integrated in at least one semiconductor die.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the aspects disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an exemplary aspect can include a computer readable media embodying a method for operating a last level clock driver to recirculate energy stored in an LC tank driven by the last level clock driver into a clock distribution network. Accordingly, the invention is not limited to illustrated examples and any means for performing the functionality described herein are included in aspects of the invention.

While the foregoing disclosure shows illustrative aspects of the invention, it should be noted that various changes and modifications could be made herein without departing from the scope of the invention as defined by the appended claims. The functions, steps and/or actions of the method claims in accordance with the aspects of the invention described herein need not be performed in any particular order. Furthermore, although elements of the invention may be described or claimed in the singular, the plural is contemplated unless limitation to the singular is explicitly stated.

What is claimed is:

1. A method of operating a last level clock driver, the method comprising:
   in a first stage, enabling the last level clock driver to store energy in an inductor-capacitor (LC) tank; and
   in a second stage, fully or partially disabling the last level clock driver and recirculating the energy stored in the LC tank into a clock distribution network.

2. The method of claim 1, wherein in a first mode of the second stage, fully disabling the last level clock driver by turning off a pull-up transistor and a pull-down transistor of the last level clock driver.

3. The method of claim 1, further comprising in a second mode of the second stage, partially disabling the last level clock driver by turning off at most one of a pull-up transistor and a pull-down transistor of the last level clock driver.

4. The method of claim 1, wherein enabling the last level clock driver in the first stage comprises enabling a pull-up transistor and a pull-down transistor of the last level clock driver.

5. The method of claim 1, further comprising controlling a duration of the first stage using a first counter programmed with a first count value corresponding to the duration of the first stage.

6. The method of claim 5, wherein the first count value is based on a quality factor of the inductor of the LC tank.

7. The method of claim 1, further comprising controlling a duration of the second stage using a second counter programmed with a second count value corresponding to the duration of the second stage.

8. The method of claim 1, further comprising, enabling the last level clock driver to replenish the energy lost by the LC tank in the recirculation of energy into the clock distribution network during the second stage, in a refreshing stage.

9. The method of claim 8, further comprising controlling a duration of the refreshing stage by using a third counter programmed with a third count value corresponding to the duration of the refreshing stage.

10. An apparatus comprising:
    a last level clock driver coupled to an inductor-capacitor (LC) tank;
    wherein, in a first stage, the last level clock driver is configured to be enabled to store energy in the inductor-capacitor (LC) tank; and
    in a second stage, the last level clock driver is configured to be fully or partially disabled, to recirculate the energy stored in the LC tank into a clock distribution network.

11. The apparatus of claim 10, wherein in a first mode of the second stage, the last level clock driver is configured to be fully disabled based on a pull-up transistor and a pull-down transistor of the last level clock driver being turned off.

12. The apparatus of claim 10, wherein in a second mode of the second stage, the last level clock driver is configured to be partially disabled based on at most one of a pull-up transistor and a pull-down transistor of the last level clock driver being turned off.

13. The apparatus of claim 10, wherein the last level clock driver is configured to be enabled in the first stage based on a pull-up transistor and a pull-down transistor of the last level clock driver being turned on.

14. The apparatus of claim 10, further comprising a first counter programmable with a first count value, wherein a duration of the first stage is based on the first count value.

15. The apparatus of claim 14, wherein the first count value is based on a quality factor of the inductor of the LC tank.

16. The apparatus of claim 14, further comprising a second counter programmable with a second count value, wherein a duration of the second stage is based on the second count value.

17. The apparatus of claim 14, wherein, in a refreshing stage, the last level clock driver is configured to be enabled to replenish the energy lost by the LC tank in the recirculation of energy into the clock distribution network during the second stage.

18. The apparatus of claim 17, further comprising a third counter programmable with a third count value, wherein a duration of the refreshing stage is based on the third count value.

19. The apparatus of claim 10, integrated in at least one semiconductor die.

20. The apparatus of claim 10, integrated in a device, selected from the group consisting of a set-top box, music player, video player, entertainment unit, navigation device, communications device, personal digital assistant (PDA), fixed location data unit, and a computer.

21. A system comprising:
   in a first stage, means for enabling a last level clock driver to store energy in an inductor-capacitor (LC) tank; and
   in a second stage, means for fully or partially disabling the last level clock driver to recirculate the energy stored in the LC tank into a clock distribution network.

22. The system of claim 21, further comprising means for controlling a duration of the first stage.

23. The system of claim 21, further comprising means for controlling a duration of the second stage.

24. The system of claim 21, further comprising, means for enabling the last level clock driver to replenish the energy lost by the LC tank in the recirculation of energy into the clock distribution network during the second stage, in a refreshing stage.

25. The system of claim 24, further comprising means for controlling a duration of the refreshing stage.

* * * * *